(12) United States Patent
Otsubo (10) Patent No.: US 9,854,680 B2
(45) Date of Patent: Dec. 26, 2017

(54) MULTILAYER SUBSTRATE

(71) Applicant: Murata Manufacturing Co., Ltd., Kyoto (JP)

(72) Inventor: Yoshihito Otsubo, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/214,680

(22) Filed: Jul. 20, 2016

(65) Prior Publication Data

US 2016/0330844 A1 Nov. 10, 2016

Related U.S. Application Data

(63) Continuation of application No. PCT/JP2015/059341, filed on Mar. 26, 2015.

(30) Foreign Application Priority Data

Apr. 10, 2014 (JP) .................................. 2014-081123

(51) Int. Cl.
*H05K 1/18* (2006.01)
*H05K 3/46* (2006.01)

(52) U.S. Cl.
CPC ........... *H05K 1/185* (2013.01); *H05K 3/4611* (2013.01); *H05K 2201/09781* (2013.01); *H05K 2201/2009* (2013.01)

(58) Field of Classification Search
CPC ......... H05K 1/185; H05K 2201/09781; H05K 2201/2009; H05K 3/4611
See application file for complete search history.

(56) References Cited

U.S. PATENT DOCUMENTS 6,281,446 B1 * 8/2001 Sakamoto ............... H01L 23/13
174/255
7,893,527 B2 * 2/2011 Shin ..................... H01L 21/4857
257/678

(Continued)

FOREIGN PATENT DOCUMENTS

JP 2008-141007 A 6/2008
JP 2009-054930 A 3/2009

(Continued)

OTHER PUBLICATIONS

Written Opinion for PCT/JP2015/059341 dated Jun. 30, 2015.
International Search report for PCT/JP2015/059341 dated Jun. 30, 2015.

*Primary Examiner* — Yuriy Semenenko
(74) *Attorney, Agent, or Firm* — Pearne & Gordon LLP (57) ABSTRACT

A multilayer substrate comprises: a stack having a plurality of insulating base materials; a first component arranged within the stack at a first level in a thickness direction of the stack; a second component arranged within the stack at a second level different from the first level and arranged so that, in a plan view, at least a portion of the second component overlaps with a portion of the first component; and a supplementary member arranged to at least partly exist in a range, in a thickness direction, as high as or higher than a lower end of the second component and as high as or lower than an upper end of the second component, and in a plan view, within a region of a projected area of the first component not overlapped with the second component, the supplementary member having a rigidity higher than the insulating base materials.

16 Claims, 10 Drawing Sheets (56) References Cited

U.S. PATENT DOCUMENTS

| | | | |
|---|---|---|---|
| 8,779,299 B2* | 7/2014 | Tsuyutani | H01L 23/5389 |
| | | | 174/260 |
| 9,351,410 B2* | 5/2016 | Nanjo | H01L 21/486 |
| 9,532,469 B2* | 12/2016 | Baba | H05K 1/0298 |
| 2008/0263860 A1* | 10/2008 | Mok | H01L 23/5389 |
| | | | 29/847 |
| 2009/0008136 A1* | 1/2009 | Ikeguchi | H01L 23/5383 |
| | | | 174/255 |
| 2011/0155433 A1 | 6/2011 | Funaya et al. | |
| 2012/0247819 A1 | 10/2012 | Tsuyutani et al. | |
| 2014/0321085 A1 | 10/2014 | Adachi | |

FOREIGN PATENT DOCUMENTS

| | | |
|---|---|---|
| JP | 2012-212818 A | 11/2012 |
| JP | 2013-110299 A | 6/2013 |
| WO | 2010/024233 A1 | 3/2010 |
| WO | 2012/132524 A1 | 10/2012 |
| WO | 2013/121976 A1 | 8/2013 |

\* cited by examiner

MULTILAYER SUBSTRATE

CROSS-REFERENCE TO RELATED APPLICATIONS

This application is a continuation of International Application No. PCT/JP2015/059341 filed on Mar. 26, 2015 which claims priority from Japanese Patent Application No. 2014-081123 filed on Apr. 10, 2014. The contents of these applications are incorporated herein by reference in their entireties.

FIELD OF THE DISCLOSURE

The present disclosure relates to a multilayer substrate.

DESCRIPTION OF THE RELATED ART

There is a case in which an electronic component is incorporated in a multilayer substrate formed by stacking in layers resin films made of thermoplastic resin. An invention in which stress acting on an electronic component incorporated in such a multilayer substrate is reduced for the purpose of suppressing damage to the electronic component is described in Japanese Patent Laying-Open No. 2008-141007 (patent document 1). In patent document 1, some of a plurality of resin films forming the multilayer substrate is provided with a throughhole for inserting the electronic component therethrough.

PTD 1: Japanese Patent Laying-Open No. 2008-141007

BRIEF SUMMARY OF THE DISCLOSURE

A layout in incorporating components in a resin multilayer substrate is increasingly increased in density. There is also a case arising in which components incorporated in a single resin multilayer substrate have a positionally overlapping relationship in a plan view. Some of the incorporated components may be breakable. For example, a component having a large area and being thin such as an IC (integrated circuit) may be breakable. When a plurality of components including such a breakable component have a positionally overlapping relationship in a single resin multilayer substrate in a plan view, there is a possibility of a defect, that is, the breakable component may be broken when stacked collectively.

Furthermore, when a component is incorporated in a flexible substrate, and the flexible substrate is bent in use, a stress may be caused to the component. In particular, when a resin multilayer substrate in which a plurality of components are incorporated overlapping one another in a plan view is bend in use, the components are placed in a severe condition and thus breakable. This tendency is significant when the components are incorporated densely in particular. Accordingly, it has been necessary to take an approach to prevent the incorporated component from being broken in such a case.

The invention described in patent document 1 is only such that the height of an electronic component in a direction of insertion is made smaller than the thickness of a resin film provided with a throughhole, and it does not consider a case in which a plurality of components are incorporated in a single resin multilayer substrate and have a positional relationship such that they overlap each other in a plan view.

Accordingly, the present disclosure contemplates providing a multilayer substrate preventing components incorporated in a single such multilayer substrate from being breakable even in a case in which the incorporated components have a positionally overlapping relationship in a plan view.

In order to achieve the above object, a multilayer substrate according to the present disclosure comprises: a stack formed of a plurality of insulating base materials; a first component arranged at a first level in a thickness direction of the stack within the stack; a second component arranged at a second level different from the first level within the stack and arranged so that, in a plan view, at least a portion of the second component overlaps a portion of the first component; and a supplementary member arranged so as to at least partly exist in a range which is, in a thickness direction, as high as or upper than a lower end of the second component and as high as or lower than an upper end of the second component, and in a plan view, within a region which is within a projected area of the first component and does not overlap the second component, a rigidness of the supplementary member being higher than that of the insulating base materials.

According to the present disclosure, a supplementary member more rigid than an insulating base material is at least partially located in a projected area of a first component within a range of a region that does not overlap a second component and accordingly, a state where the first component is breakable can be resolved. Thus according to the present disclosure a multilayer substrate having a component incorporated therein less breakably can be provided.

DETAILED DESCRIPTION OF THE DISCLOSURE

First Embodiment

Figure 1:
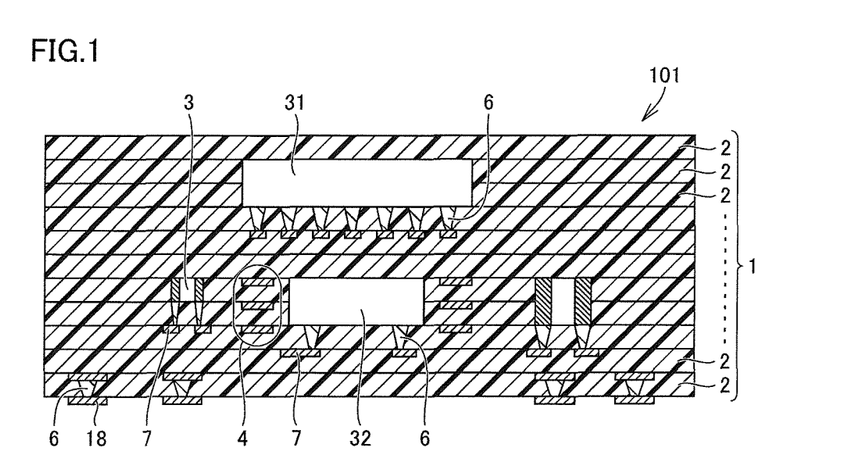
FIG. 1 is a cross section of a multilayer substrate in a first embodiment based on the present disclosure.
Figure 2:
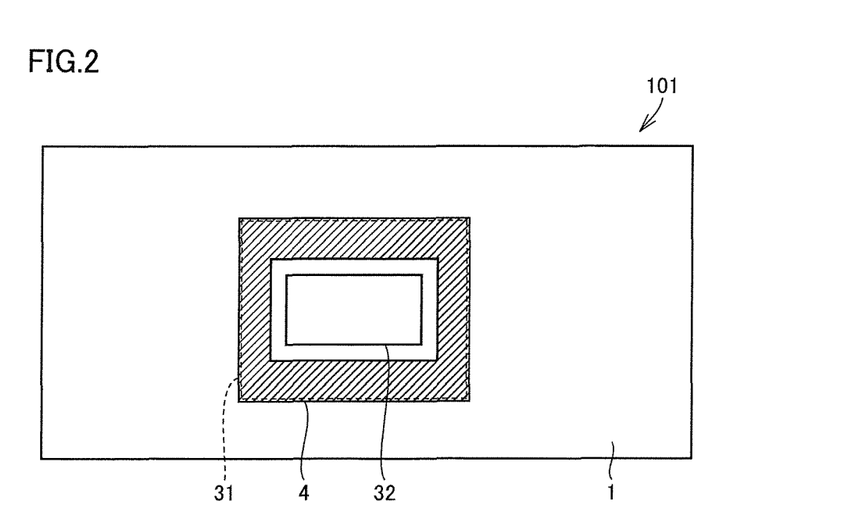
FIG. 2 is a perspective view of the multilayer substrate in the first embodiment based on the present disclosure, as seen at a lower surface thereof.
Figure 3:
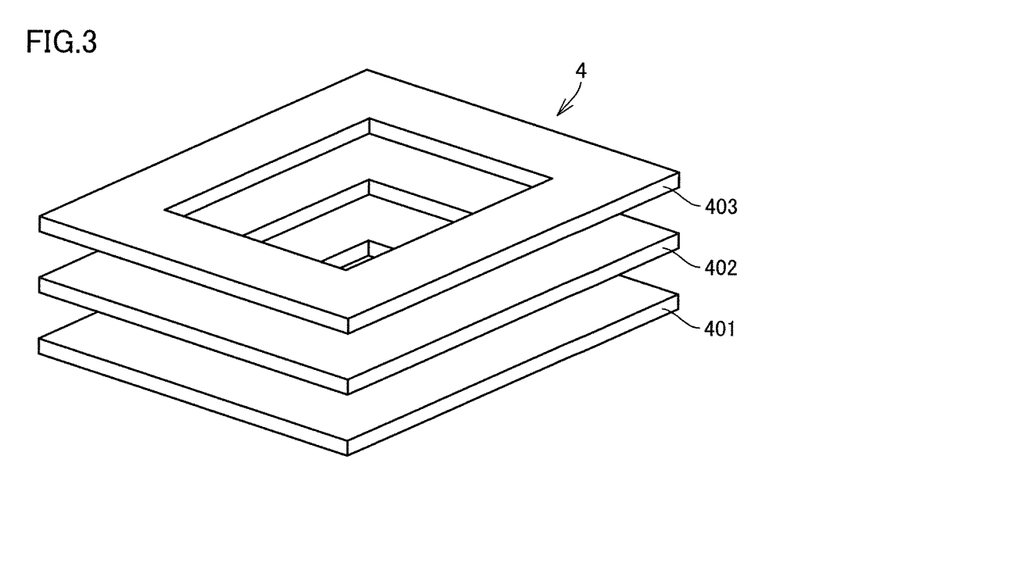
FIG. 3 is a perspective view of a supplementary member included in the multilayer substrate in the first embodiment based on the present disclosure.

With reference to FIGS. 1-3, the following illustrates a multilayer substrate 101 in a first embodiment based on the present disclosure.

As shown in FIG. 1, multilayer substrate 101 comprises: a stack 1 formed of a plurality of insulating base materials 2; a first component 31 arranged at a first level in a thickness direction of stack 1 within stack 1; a second component 32 arranged at a second level different from the first level within stack 1 and arranged so that, in a plan view, at least a portion of second component 32 overlaps a portion of first component 31; and a supplementary member 4 arranged so as to at least partly exist in a range which is, in a thickness direction, as high as or upper than a lower end of second component 32 and as high as or lower than an upper end of second component 32, and in a plan view, within a region which is within a projected area of first component 31 and does not overlap second component 32, a rigidness of supplementary member 4 being higher than that of insulating base materials 2.

As shown in FIG. 1, multilayer substrate 101 may include a component 3 in addition to first component 31 and second component 32. Multilayer substrate 101 may include an interlayer connection conductor 6 and a conductive pattern 7 therein. In the example shown in FIG. 1, multilayer substrate 101 has a lowermost surface provided with an external electrode 18, however, this is only one example and whether external electrode 18 is present/absent, how many external electrodes 18 are provided, what shape external electrode 18 has, and the like are not limited in that way. For example, in addition to or instead of the external electrode at the lowermost surface, the external electrode may be provided at the topmost surface.

In order to more clarify the positional relationship of first component 31, second component 32, and supplementary member 4, a state where multilayer substrate 101 is seen through from below is shown in FIG. 2. FIG. 2 only shows first component 31, second component 32, and supplementary member 4 for the sake of illustration. Other perspective views referred to hereinafter are also similar.

First component 31 is larger than second component 32 and second component 32 is disposed to overlap a vicinity of a center of first component 31, and accordingly, in FIG. 2, around second component 32, there is a region where first component 31 does not overlap second component 32. Supplementary member 4 overlaps this region. The outer edge of supplementary member 4 and the outer edge of first component 31 substantially match.

Supplementary member 4 is composed of a conductive pattern identical in material to conductive pattern 7. FIG. 3 shows supplementary member 4 alone extracted from multilayer substrate 101. In this example, supplementary member 4 is a set of three layers of conductive patterns each formed in a frame and put together. Supplementary member 4 includes a conductive pattern 401, a conductive pattern 402, and a conductive pattern 403. The conductive patterns belonging to a single supplementary member 4 may thus be isolated from one another. Individual conductive patterns 401, 402, 403 belonging to supplementary member 4 are producible in the same manner as existing conductive pattern 7.

In the present embodiment, supplementary member 4 more rigid than insulating base material 2 is at least partially located in a projected area of first component 31 within a range of a region that does not overlap second component 32 and accordingly, a state where first component 31 is breakable can be resolved. In other words, the present embodiment can provide a multilayer substrate preventing components incorporated in a single such multilayer substrate from being breakable even in a case in which the incorporated components have a positionally overlapping relationship in a plan view.

While the example shown in FIG. 2 shows supplementary member 4 is disposed so that its entire portion is exactly accommodated in a region in which first component 31 does not overlap second component 32, it is not necessary that supplementary member 4 be entirely accommodated in this region. Supplementary member 4 may at least partially be accommodated in this region. Furthermore, preferably, at least a main portion of supplementary member 4 is accommodated in this region. The main portion as referred to herein shall indicate a portion occupying a half or more as compared in area in a plan view.

As indicated in the present embodiment, preferably, supplementary member 4 has an outer edge overlapping an outer edge of the projected area of first component 31 in a region that does not overlap second component 32 in a plan view. With the outer edge overlapping, when multilayer substrate 101 is bent, second component 32 and supplementary member 4 behave as an existence equivalent to first component 31, which facilitates preventing first component 31 from being broken. Although preferably the contour line of supplementary member 4 completely overlaps that of first component 31, more or less offset contour lines can still have an effect of an extent.

As indicated in the present embodiment, preferably, supplementary member 4 is a conductive pattern. By adopting this configuration, the supplementary member can be easily implemented.

Preferably, supplementary member 4 is a set of a plurality of conductive patterns isolated from one another in their thickness direction and thus aligned. By adopting this configuration, the supplementary member can be easily produced, and by selecting the number of conductive patterns appropriately, the supplementary member can be provided with desired strength.

Note that while supplementary member 4 is illustrated in FIG. 1-FIG. 3 as what is formed of a looped conductive pattern as an example, the conductive pattern serving as the supplementary member may not be a complete loop. The supplementary member may be formed of a substantially looped conductive pattern which has a discontinued portion for example.

While the present embodiment illustrates supplementary member 4 as a set of three layers of conductive patterns in the thickness direction by way of example, supplementary member 4 is not necessarily formed of the three layers of conductive patterns. For example, it may be configured as indicated in the following embodiment.

Second Embodiment

Figure 4:
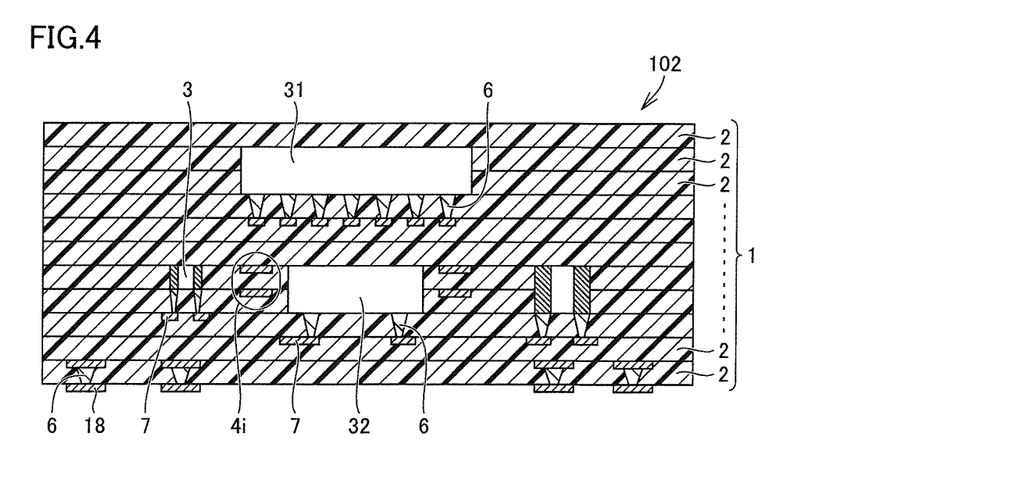
FIG. 4 is a cross section of a multilayer substrate in a second embodiment based on the present disclosure.

With reference to FIG. 4, the following illustrates a multilayer substrate 102 in a second embodiment based on the present disclosure. Multilayer substrate 103 includes a supplementary member 4i configured of two layers of conductive patterns. The supplementary member may thus be configured of a small number of conductive patterns. The height of supplementary member 4i may be smaller than the height of second component 32. When first component 31 is over second component 32, then, as shown in FIG. 4, preferably, the upper end of supplementary member 4i substantially matches the upper end of second component 32. In contrast, when first component 31 is under second component 32, preferably, the lower end of supplementary member 4i substantially matches the lower end of second component 32.

Multilayer substrate 102 in the present embodiment can also provide an effect similar to that described in the first embodiment. When a reinforcement member by a conductive pattern is disposed to be distributed throughout the thickness of second component 32, as indicated in the first embodiment, and accordingly, the reinforcement member has excessively large strength, then, in order to adjust the strength of the supplementary member, it is also effective to have a configuration which reduces the number of conductive patterns configuring the supplementary member, as done in the present embodiment.

Although the present embodiment indicates an example in which it the supplementary member is configured of two layers of conductor patterns, the number of conductive patterns may further be reduced, as the following embodiment shows.

Third Embodiment

Figure 5:
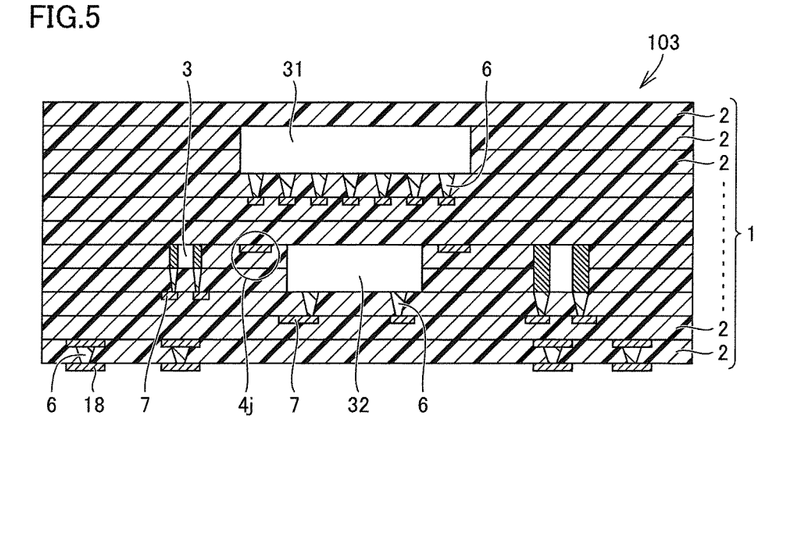
FIG. 5 is a cross section of a multilayer substrate in a third embodiment based on the present disclosure.

With reference to FIG. 5, the following illustrates a multilayer substrate 103 in a third embodiment based on the present disclosure. Multilayer substrate 103 includes a supplementary member 4j. The supplementary member 4j is configured of only a single layer of a conductive pattern. Also, in this case, it is preferred that the single layer of a conductive pattern is disposed to be substantially equal in level to a surface of second component 32 closer to first component 31.

Multilayer substrate 103 in the present embodiment can also provide an effect similar to those described in the previously described embodiments.

While the supplementary member may be one or more conductive patterns aligned as indicated in the first to third embodiments, the supplementary member's constituent is not limited to the conductive pattern. For example, as the following embodiment indicates, it may be a conductive pattern combined with another structure.

Fourth Embodiment

Figure 6:
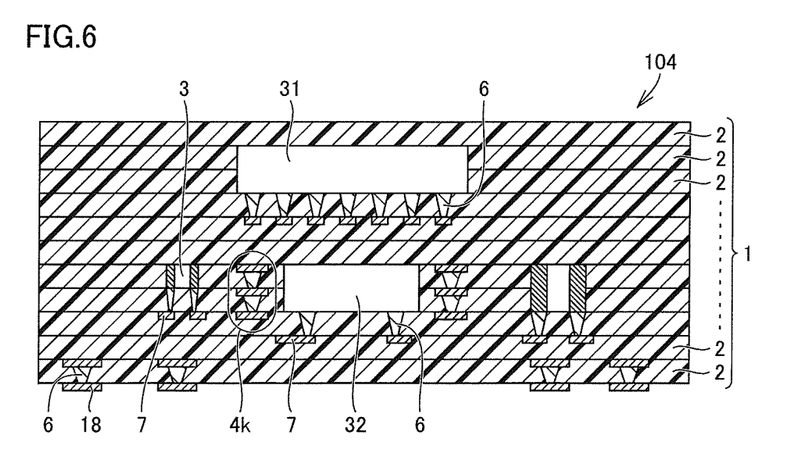
FIG. 6 is a cross section of a multilayer substrate in a fourth embodiment based on the present disclosure.

With reference to FIG. 6, the following illustrates a multilayer substrate 104 in a fourth embodiment based on the present disclosure. Multilayer substrate 104 includes supplementary member 4k of a structure which combines a conductive pattern and an interlayer connection conductor together. Supplementary member 4k has a structure in which a plurality of conductive patterns isolated from one another in the thickness direction are connected to one another in the thickness direction by the interlayer connection conductor.

Multilayer substrate 104 in the present embodiment can also provide an effect similar to those described in the previously described embodiments. In particular, in the present embodiment, not only is a conductive pattern alone used but also an interlayer connection conductor is combined thereto, and the supplementary member's strength can be increased. When increasing the supplementary member's strength to prevent a component from being broken is desired, a configuration such as the present embodiment is effective.

Fifth Embodiment

Figure 7:
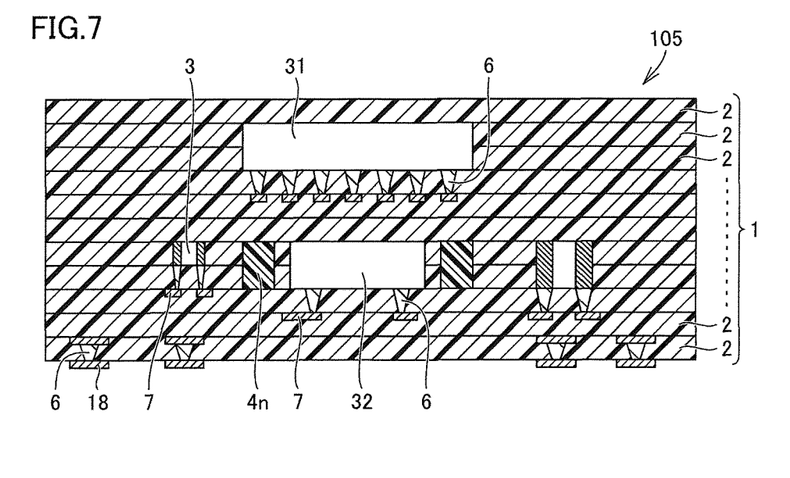
FIG. 7 is a cross section of a multilayer substrate in a fifth embodiment based on the present disclosure.
Figure 8:
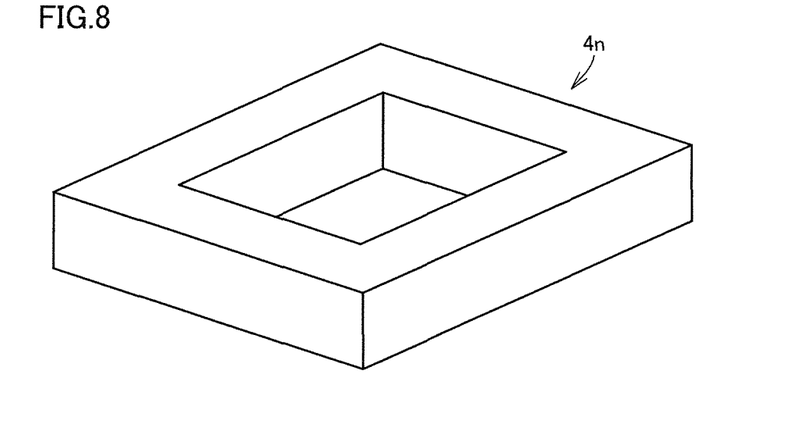
FIG. 8 is a perspective view of a supplementary member included in the multilayer substrate in the fifth embodiment based on the present disclosure.

With reference to FIGS. 7 and 8, the following illustrates a multilayer substrate 105 in a fifth embodiment based on the present disclosure. Multilayer substrate 105 includes a supplementary member 4n. Supplementary member 4n is formed of resin. Supplementary member 4n can be formed by providing a cavity in insulating base material 2, introducing liquefied or granular resin into the cavity, and solidifying the resin. Resin as referred to herein can be thermosetting resin. Thermosetting resin as referred to herein can be epoxy resin for example. The cavity for introducing the resin may be formed by laser-machining and thus removing a portion of insulating base material 2 when insulating base material 2 is stacked partway, or by previously providing individual insulating base materials 2 with a throughhole and stacking insulating base materials 2 having the throughhole. FIG. 8 shows supplementary member 4n alone extracted from multilayer substrate 105. In this example, supplementary member 4n is a one-piece member in the form of a frame. Preferably, the supplementary member is a member made of thermosetting resin.

Multilayer substrate 105 in the present embodiment can also provide an effect similar to those described in the previously described embodiments. The supplementary member may be formed of a material other than resin as long as the supplementary member occupies a desired size in the stack and has desired strength therein.

Figure 9:
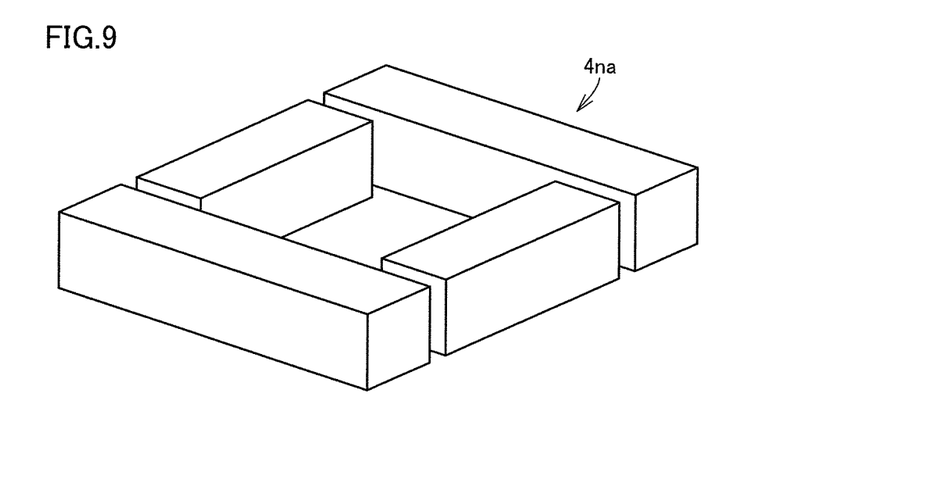
FIG. 9 is a perspective view of an exemplary variation of the supplementary member included in the multilayer substrate in the fifth embodiment based on the present disclosure.

The supplementary member produced by introducing resin, as indicated in the present embodiment, is not limited to one piece such as supplementary member 4n shown in FIG. 8, and it may instead be divided as appropriate, such as a supplementary member 4na as shown in FIG. 9. Whether the supplementary member may be formed completely peripherally in one piece or divided into some pieces, it is similarly effective.

While the first to fourth embodiments indicate the supplementary member as being configured in a form including one or more conductive patterns, it is not a requirement to use a conductive pattern to configure the supplementary member. As indicated in the present embodiment, the supplementary member may be of a configuration which does not include the conductive pattern at all. What is considered as important as a function of the supplementary member is its shape and strength and whether the supplementary member is formed of conductor is not questioned.

Sixth Embodiment

Figure 10:
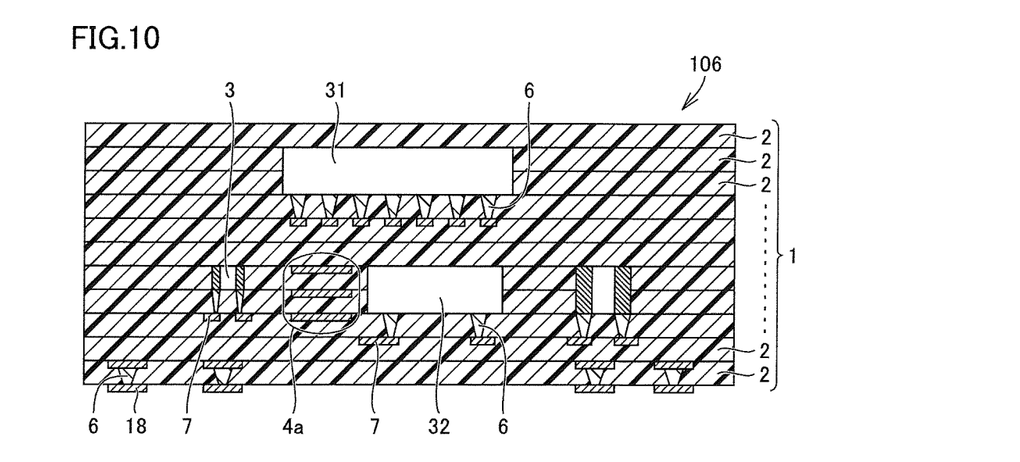
FIG. 10 is a cross section of a multilayer substrate in a sixth embodiment based on the present disclosure.
Figure 11:
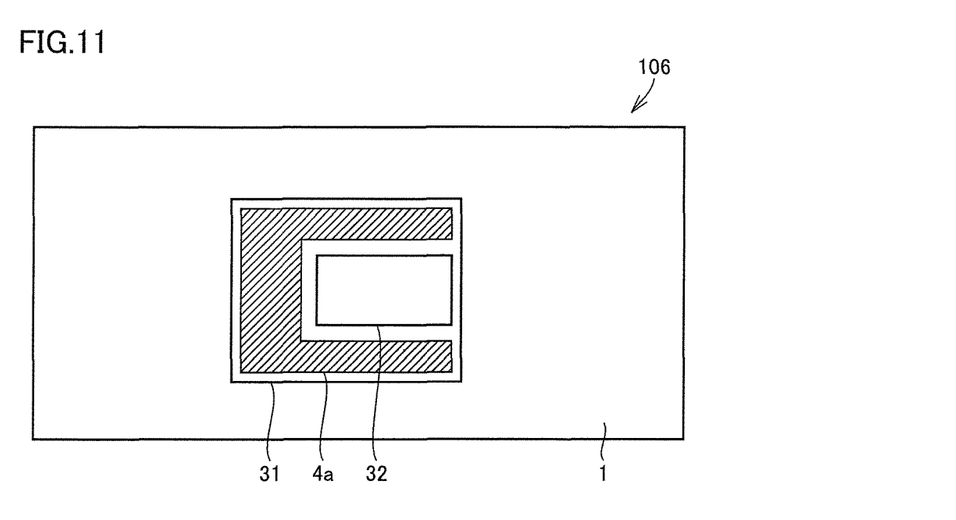
FIG. 11 is a perspective view of the multilayer substrate in the sixth embodiment based on the present disclosure, as seen at a lower surface thereof.

With reference to FIG. 10, the following illustrates a multilayer substrate 106 in a sixth embodiment based on the present disclosure. A state where multilayer substrate 106 is seen through from below is shown in FIG. 11. FIG. 11 shows only first component 31, second component 32, and supplementary member 4a only in their positional relationship for the sake of illustration.

When multilayer substrate 106 is compared with those of the previous embodiments, the position of second component 32 relative to first component 31 is different. Second component 32 in a plan view is positioned closer to a side of first component 31, rather than at the center of first component 31. In a plan view, one side of second component 32 substantially overlaps one side of first component 31. In the example shown in FIG. 10 and FIG. 11, one side of second component 32 does not completely overlap one side of first component 31; rather, one side of second component 32 is disposed at position which recedes slightly inwards from one side of first component 31.

Multilayer substrate 106 in the present embodiment can also provide an effect similar to those described in the previously described embodiments.

In order to minimize a load unequally exerted to any portion of first components 31, as indicated in the present embodiment, preferably, first component 31 has its entire perimeter overlapped in a uniform condition. More specifically, for example, as indicated in the present embodiment, when first component 31 and second component 32 are disposed such that one side of second component 32 recedes slightly from one side of first component 31, then, preferably, as shown in FIG. 11, an outer edge of supplementary member 4a also recedes inwards to the same extent relative to an outer edge of first component 31.

Seventh Embodiment

Figure 12:
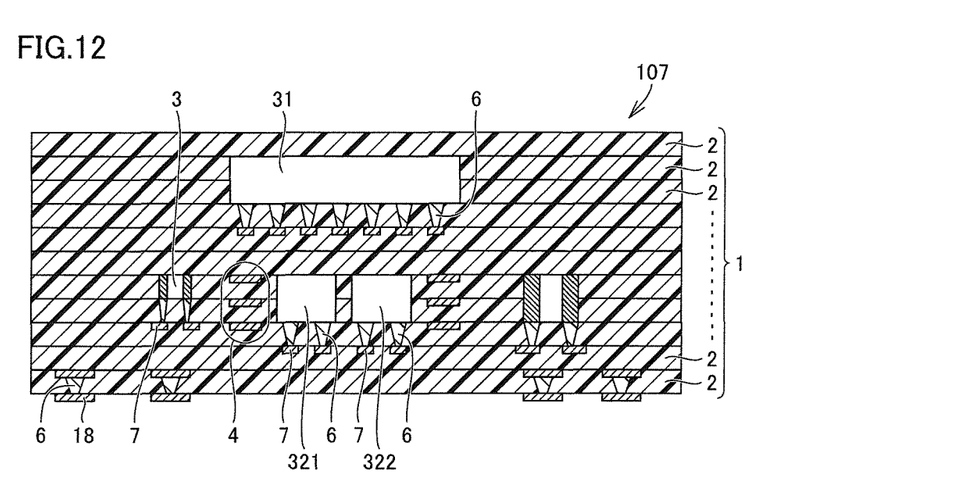
FIG. 12 is a cross section of a multilayer substrate in a seventh embodiment based on the present disclosure.

With reference to FIG. 12, the following illustrates a multilayer substrate 107 in a seventh embodiment based on the present disclosure. As the present embodiment indicates, a plurality of second components may be disposed in a single multilayer substrate. Two second components are incorporated in multilayer substrate 107. In other words, second components 321, 322 are disposed under first component 31.

As shown in FIG. 12, when second components 321, 322 are aligned adjacent to each other in the projection area of first component 31, second components 321, 322 may be regarded as if they were a single second component, and supplementary member 4 may be disposed to surround it. Supplementary member 4 in the example shown in FIG. 12 is equivalent to supplementary member 4 in the example shown in FIG. 1.

Multilayer substrate 107 in the present embodiment can also provide an effect similar to those described in the previously described embodiments.

Eighth Embodiment

Figure 13:
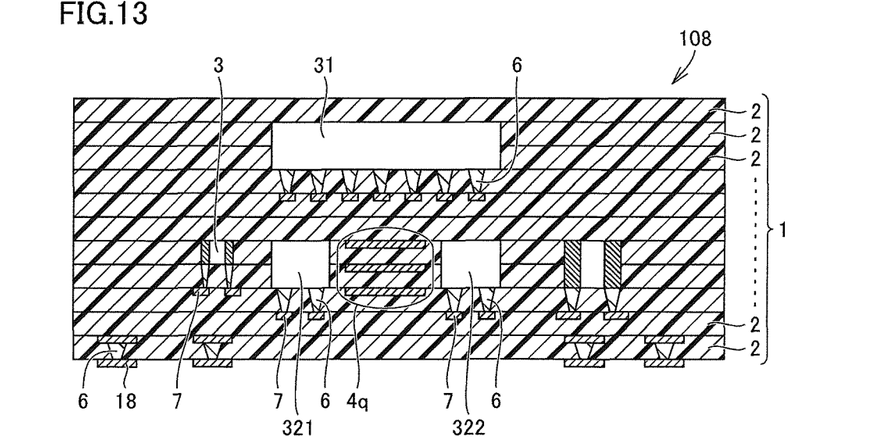
FIG. 13 is a cross section of a multilayer substrate in an eighth embodiment based on the present disclosure.

With reference to FIG. 13, the following illustrates a multilayer substrate 108 in an eighth embodiment based on the present disclosure. As the present embodiment indicates, a plurality of second components may be disposed in a single multilayer substrate at positions separate from each other. In multilayer substrate 108, second components 321, 322 are disposed under the first component 31. Note that second components 321, 322 are separated from each other. When observed in FIG. 13, second component 321 is disposed under the left end of first component 31, and second component 322 is disposed under the right end thereof. Accordingly, a large gap results between second components 321 and 322, and supplementary member 4q is disposed to be accommodated in that gap. While supplementary member 4q is conductive patterns aligned in the thickness direction as an example, it is not limited thereto and may be a supplementary member in another configuration.

Multilayer substrate 108 in the present embodiment can also provide an effect similar to those described in the previously described embodiments. When supplementary member 4q is absent, there is a possibility that first component 31 may have stress concentration cause in a portion thereof corresponding to the gap between second components 321 and 322, and as a result, there is a possibility that it may be broken. By disposing supplementary member 4q, the portion is increased in strength, which can reduce the possibility that first component 31 may be broken.

While the previous embodiments indicate an example in which a first component is larger than a second component, their relationship in size may be opposite. Furthermore, the first component and the second component may be equivalent in size.

Ninth Embodiment

Figure 14:
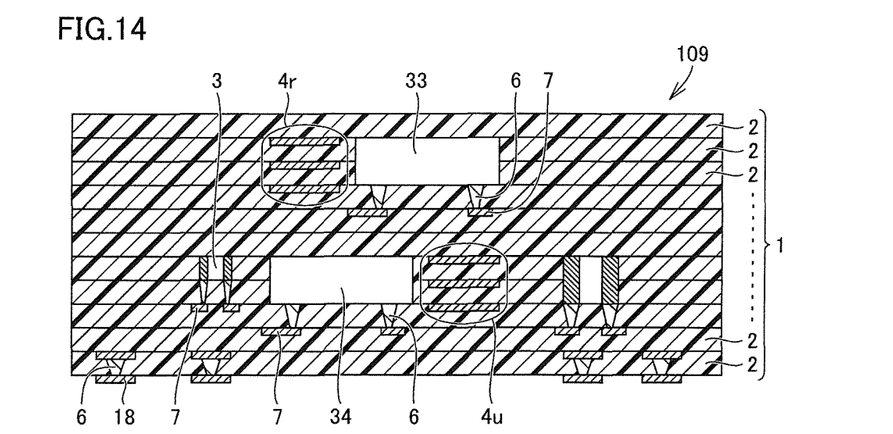
FIG. 14 is a cross section of a multilayer substrate in a ninth embodiment based on the present disclosure.

With reference to FIG. 14, the following illustrates a multilayer substrate 109 in a ninth embodiment based on the present disclosure. Multilayer substrate 109 incorporates components 33 and 34 equivalent in size. Components 33 and 34 may also be of the same degree in breakability. In multilayer substrate 109, components 33 and 34 are in a laterally offset positional relationship in the thickness direction, rather than a completely overlapping positional relationship in the thickness direction. Accordingly, while a portion of component 33 and a portion of component 34 overlap, another portion of component 33 and that of component 34 do not overlap. In such a configuration, as shown in FIG. 14, a configuration is preferable in which supplementary members 4r and 4u are disposed to fill a portion at which the components do not overlap.

Multilayer substrate 109 in the present embodiment can also provide an effect similar to those described in the previously described embodiments. In the present embodiment, the supplementary member is disposed over or under a region in which two components do not overlap and only one of the components extends, which allows these portions to have a condition in strength close to a uniform condition and allows a multilayer substrate with less breakable incorporated components.

Tenth Embodiment

Figure 15:
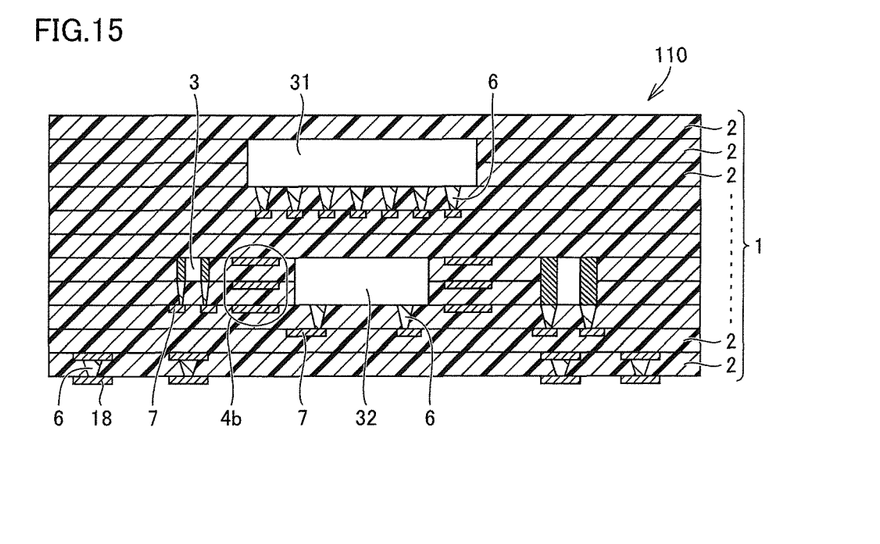
FIG. 15 is a cross section of a multilayer substrate in a tenth embodiment based on the present disclosure.
Figure 16:
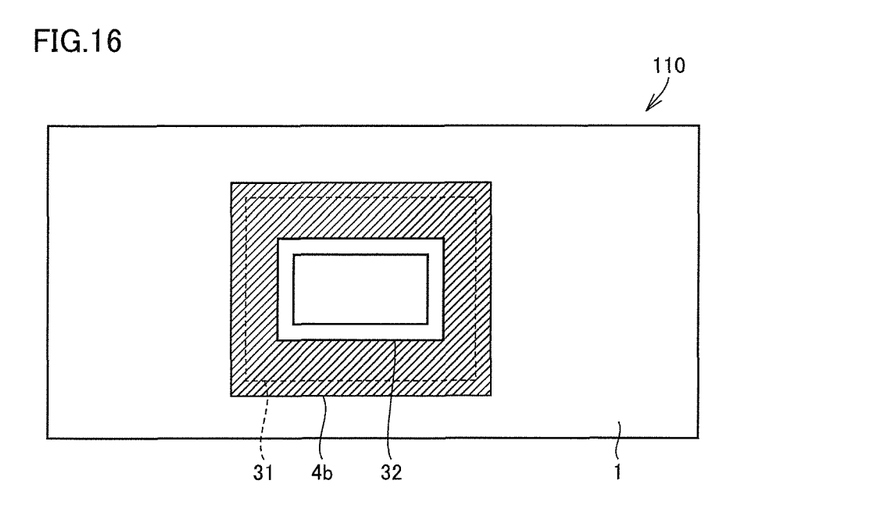
FIG. 16 is a perspective view of the multilayer substrate in the tenth embodiment based on the present disclosure, as seen at a lower surface thereof.

With reference to FIG. 15, the following illustrates a multilayer substrate 110 in a tenth embodiment based on the present disclosure. A state where multilayer substrate 110 is seen through from below is shown in FIG. 16. In multilayer substrate 110, a supplementary member 4b extends slightly outer than first component 31. Thus a configuration in which supplementary member 4b extends slightly outward may be adopted. In this configuration also, when a portion of supplementary member 4b that projects outer than first component 31 is not so large, it can be said that an outer edge of supplementary member 4 and an outer edge of first component 31 substantially match.

Multilayer substrate 110 in the present embodiment can also provide an effect similar to those described in the previously described embodiments. In a case in which an attempt is made to implement a configuration in which an outer edge of the supplementary member and an outer edge of the first component substantially match in a plan view, when an assembly error is also taken into consideration, it is realistic to give some margin to the size of the supplementary member, and accordingly, it is possible to provide a configuration in which the supplementary member extends slightly outer than first component 31 as has been described in the present embodiment.

Figure 17:
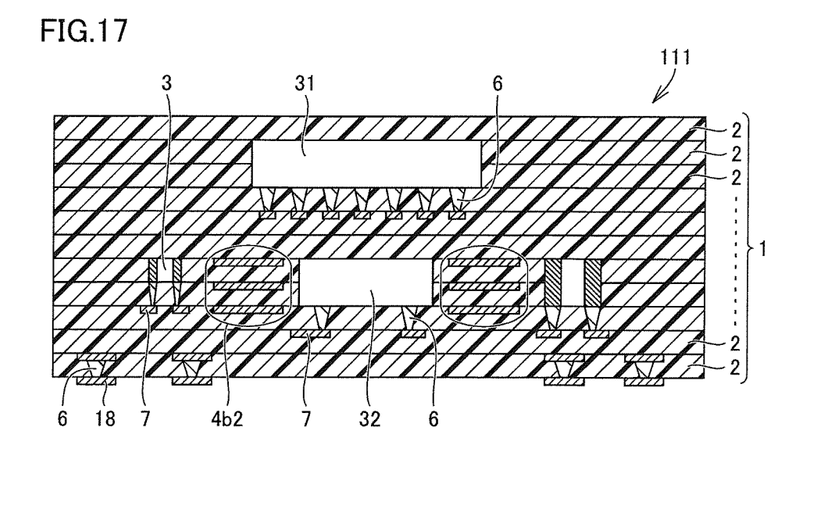
FIG. 17 is a cross section of an exemplary variation of the multilayer substrate in the tenth embodiment based on the present disclosure.
Figure 18:
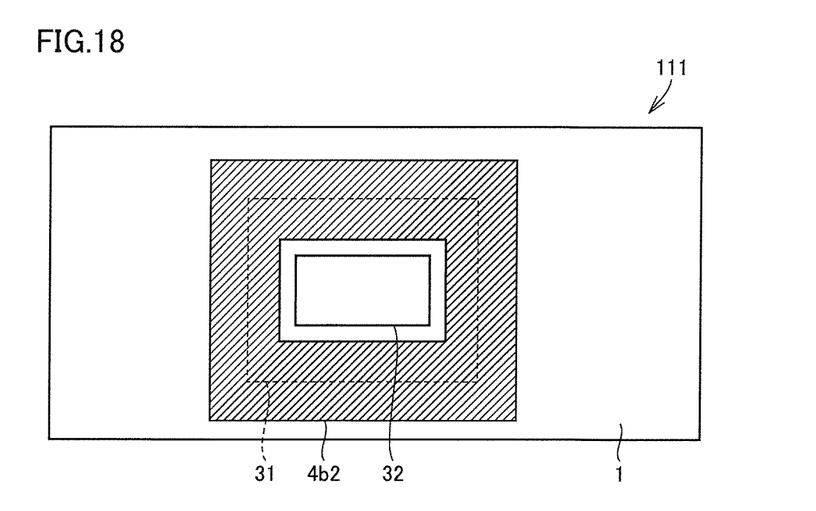
FIG. 18 is a perspective view of the exemplary variation of the multilayer substrate in the tenth embodiment based on the present disclosure, as seen at a lower surface thereof.

The supplementary member may be given a further larger margin. FIG. 17 shows a multilayer substrate 111 as one example thereof. A state where multilayer substrate 111 is seen through from below is shown in FIG. 18. In multilayer substrate 111, a supplementary member 4b2 is provided to surround second component 32. Supplementary member 4b2 is disposed to extend outward significantly beyond an outer edge of first component 31. If the supplementary member's installation space has a room, thus disposing the supplementary member extensively is also considered. Such a large supplementary member allows first component 31 to be accommodated in the projected area of supplementary member 4b2 even when first component 31 is more or less positionally offset, and tolerance for assembly error is increased.

Eleventh Embodiment

Figure 19:
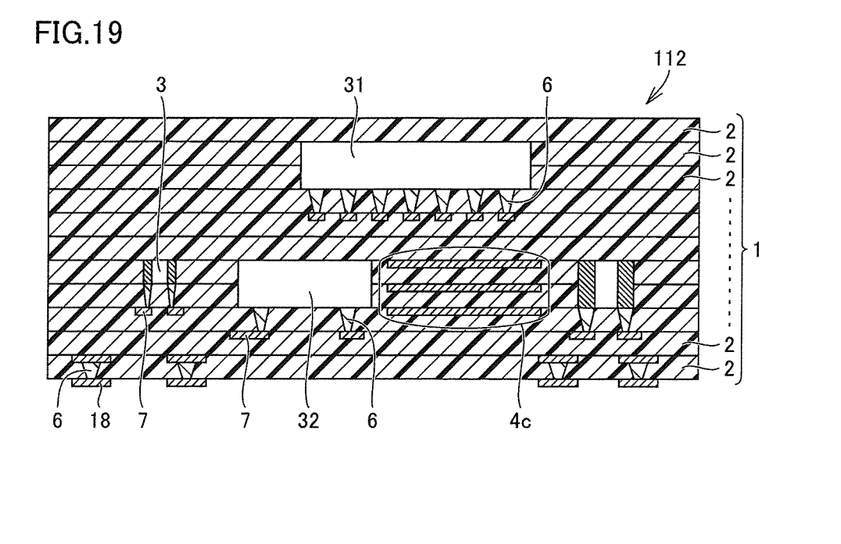
FIG. 19 is a cross section of a multilayer substrate in an eleventh embodiment based on the present disclosure.
Figure 20:
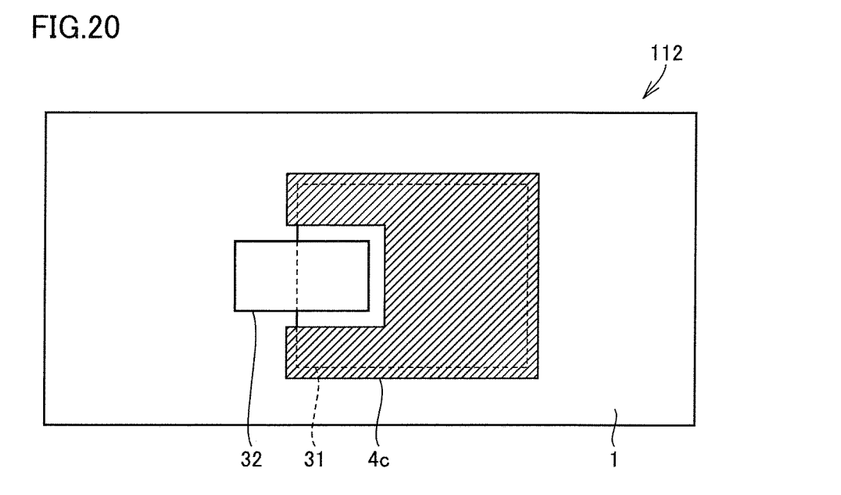
FIG. 20 is a perspective view of the multilayer substrate in the eleventh embodiment based on the present disclosure, as seen at a lower surface thereof.

With reference to FIG. 19, the following illustrates a multilayer substrate 112 in an eleventh embodiment based on the present disclosure. A state where multilayer substrate 112 is seen through from below is shown in FIG. 20.

Multilayer substrate 112 in the present embodiment has a basic configuration similar to those described in the previous embodiments, except for the following:

In multilayer substrate 112, second component 32 is disposed to straddle an outer edge of first component 31 in a plan view. Supplementary member 4c is disposed to straddle an outer edge of first component 31 in a section other than that straddled by second component 32 in a plan view.

Although in the present embodiment second component 32 is disposed at a position offset from first component 31, even in this case, supplementary member 4c is disposed to straddle an outer edge of first component 31 in a section other than that straddled by second component 32, and first component 31 has its outer edge and a vicinity thereof in a condition close to a uniform condition and a multilayer substrate with first component 31 less breakable can be provided.

In particular, as shown in FIG. 20, preferably, supplementary member 4c is disposed to straddle an outer edge of first component 31 substantially entirely other than that straddled by second component 32 in a plan view. With such a configuration, a uniform condition is achieved along the entire perimeter of the outer edge of first component 31, and a multilayer substrate with first component 31 further less breakable can be provided.

Note that while each embodiment indicates an example in which in a single multilayer substrate there is only one pair of the first component and the second component, this is not exclusive and there may be a plurality of pairs of the first component and the second component in a single multilayer substrate.

Note that insulating base material 2 may be formed of resin. More specifically, insulating base material 2 may be formed of thermoplastic resin. Thermoplastic resin as referred to herein is LCP (liquid crystal polymer) for example. Other than LCP, the thermoplastic resin adopted may be PEEK (polyetheretherketone), PEI (polyetherimide), PPS (polyphenylene sulfide), thermoplastic PI (polyimide), etc.

Note that in the multilayer substrate shown in each figure, the number of insulating base materials 2 included in stack 1 is an example and is not limited to thereto. The number of insulating base materials 2 included in a single stack 1 may be more or less than the example.

Stack 1 is not limited to a simple rectangle in cross section. It may be of a configuration allowing a portion to have a varied entire thickness. The number of insulating base materials 2 stacked in layers may be changed depending on a portion of stack 1. The multilayer substrate may have a surface with some component mounted thereon.

It should be understood that the embodiments disclosed herein are illustrative and non-restrictive in any respect. The scope of the present disclosure is defined by the terms of the claims, rather than the description above, and is intended to include any modifications within the meaning and scope equivalent to the terms of the claims.

The present disclosure is applicable to multilayer substrates.

1: stack;
2: insulating base material;
3, 33, 34: component;
4, 4a, 4b, 4b2, 4c, 4i, 4j, 4k, 4n, 4na, 4q, 4r, 4u: supplementary member;
6: interlayer connection conductor;
7: conductive pattern;
18: external electrode;
31: first component;
32, 321, 322: second component;
101, 102, 103, 104, 105, 106, 107, 108, 109, 110, 111, 112: multilayer substrate;
401, 402, 403: conductive pattern (as a portion of supplementary member).

The invention claimed is:

1. A multilayer substrate, comprising:
a stack having a plurality of insulating base materials;
a first component arranged within the stack at a first level in a thickness direction of the stack;
a second component arranged within the stack at a second level different from the first level and arranged so that, in a plan view, at least a portion of the second component overlaps with a portion of the first component; and
a supplementary member arranged to at least partly exist in a range, in a thickness direction, as high as or higher than a lower end of the second component and as high as or lower than an upper end of the second component, and in a plan view, within a region of a projected area of the first component not overlapped with the second component, the supplementary member having a rigidness higher than the insulating base materials.

2. The multilayer substrate according to claim 1, wherein the supplementary member has an outer edge overlapping with an outer edge of the projected area of the first component in a region not overlapped with the second component in a plan view.

3. The multilayer substrate according to claim 1, wherein the second component is disposed to straddle an outer edge of the first component in a plan view, and the supplementary member is disposed to straddle the outer edge of the first component in a section other than a section straddled by the second component in a plan view.

4. The multilayer substrate according to claim 3, wherein the supplementary member is disposed to straddle the outer edge of the first component substantially entirely other than the section straddled by the second component in a plan view.

5. The multilayer substrate according to claim 1, wherein the supplementary member is a conductive pattern.

6. The multilayer substrate according to claim 1, wherein the supplementary member is a set of a plurality of conductive patterns arranged as isolated from one another in a thickness direction.

7. The multilayer substrate according to claim 1, wherein the supplementary member is a member comprising a thermosetting resin.

8. The multilayer substrate according to claim 2, wherein the supplementary member is a conductive pattern.

9. The multilayer substrate according to claim 3, wherein the supplementary member is a conductive pattern.

10. The multilayer substrate according to claim 4, wherein the supplementary member is a conductive pattern.

11. The multilayer substrate according to claim 2, wherein the supplementary member is a set of a plurality of conductive patterns isolated from one another in a thickness direction.

12. The multilayer substrate according to claim 3, wherein the supplementary member is a set of a plurality of conductive patterns isolated from one another in a thickness direction.

13. The multilayer substrate according to claim 4, wherein the supplementary member is a set of a plurality of conductive patterns isolated from one another in a thickness direction.

14. The multilayer substrate according to claim 2, wherein the supplementary member is a member comprising a thermosetting resin.

15. The multilayer substrate according to claim 3, wherein the supplementary member is a member comprising a thermosetting resin.

16. The multilayer substrate according to claim 4, wherein the supplementary member is a member comprising a thermosetting resin.

* * * * *